(12) United States Patent
Smith et al.

(10) Patent No.: US 11,575,391 B2
(45) Date of Patent: Feb. 7, 2023

(54) INNER FEC ENCODING SYSTEMS AND METHODS

(71) Applicant: Marvell Asia Pte. Ltd., Singapore (SG)

(72) Inventors: Benjamin P. Smith, Ottawa (CA); Ilya Lyubomirsky, San Jose, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 17/205,881

(22) Filed: Mar. 18, 2021

(65) Prior Publication Data

US 2022/0302928 A1 Sep. 22, 2022

(51) Int. Cl.
*H03M 13/00* (2006.01)
*H03M 13/15* (2006.01)
*H03M 13/39* (2006.01)
*H03M 13/11* (2006.01)

(52) U.S. Cl.
CPC ...... *H03M 13/156* (2013.01); *H03M 13/1111* (2013.01); *H03M 13/1174* (2013.01); *H03M 13/3927* (2013.01)

(58) Field of Classification Search
None
See application file for complete search history.

(56) References Cited

U.S. PATENT DOCUMENTS

| | | | |
|---|---|---|---|
| 7,765,577 B2 | 7/2010 | Bhaskaran et al. | |
| 8,385,439 B2* | 2/2013 | Djordjevic | H04B 10/2569 398/202 |
| 9,461,941 B2 | 10/2016 | Mehta et al. | |
| 9,800,361 B2 | 10/2017 | Gareau et al. | |
| 10,164,733 B2 | 12/2018 | Basso et al. | |
| 10,404,402 B2 | 9/2019 | Loprieno et al. | |
| 10,491,370 B2 | 11/2019 | Yang et al. | |
| 2008/0172593 A1* | 7/2008 | Rainish | H04L 1/0045 714/776 |
| 2009/0077448 A1 | 3/2009 | Haas et al. | |
| 2010/0293433 A1 | 11/2010 | Limberg | |
| 2013/0216221 A1* | 8/2013 | Zhang | H04L 1/0057 398/43 |
| 2015/0039964 A1* | 2/2015 | Fonseka | H03M 13/2792 714/756 |
| 2018/0192310 A1* | 7/2018 | Zhuang | H04L 25/067 |

* cited by examiner

*Primary Examiner* — Mujtaba M Chaudry

(57) ABSTRACT

The present invention is directed to communication systems and methods. According to a specific embodiment, FEC data streams from multiple FEC data lanes are received. First stage interleaving and inner encoding are performed on the FEC data streams to generate inner encoded data streams. A second stage interleaving process is performed to interleave the inner encoded data streams. There are other embodiments as well.

16 Claims, 10 Drawing Sheets

INNER FEC ENCODING SYSTEMS AND METHODS

CROSS-REFERENCES TO RELATED APPLICATIONS

The present invention is related to U.S. patent application Ser. No. 16/818,864, entitled "SYSTEMS AND METHODS FOR INTERLEAVED HAMMING ENCODING AND DECODING", filed on Mar. 13, 2020, which is commonly owned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to data communication systems and techniques thereof.

Over the last few decades, the use of communication networks has exploded. In the early days of the Internet, popular applications were limited to emails, bulletin boards, and mostly informational and text-based web page surfing, and the amount of data transferred was relatively small. Today, the Internet and mobile applications demand a huge amount of bandwidth for transferring photos, video, music, and other multimedia files. For example, a social network like Facebook processes more than 500 TB of data daily. With such high demands on data storage and data transfer, existing data communication systems need to be improved to address these needs. New data centers are constantly being built, while existing ones are expanding and upgrading.

The rate of data communication can be improved in many ways, such as via error correction. For example, Reed-Solomon codes have been used in conventional communication systems. Unfortunately, existing techniques are inadequate and improved systems and methods are desired.

BRIEF SUMMARY OF THE INVENTION

The present invention is directed to communication systems and methods. According to a specific embodiment, FEC data streams from multiple FEC data lanes are received. First stage interleaving and inner encoding are performed on the FEC data streams to generate inner encoded data streams. A second stage interleaving process is performed to interleave the inner encoded data streams. There are other embodiments as well.

According to an embodiment, the present invention provides a communication device that includes an interface for receiving FEC data streams from two or more FEC data lanes. The FEC data streams include a first FEC data stream and a second FEC data stream. The device also includes a first interleaver configured to interleave the first FEC data stream and generate a first interleaved stream. The device also includes an encoder configured to process the first interleaved stream and generate a first soft-decodable stream. The device also includes a second interleaver configured to interleave the first soft-decodable stream and generate an outgoing data stream. The second interleaver may include M lines corresponding to an interleaving depth of N. The M lines may include a first delay line and a second delay line. The first delay line may include N−1 delay units. The second delay line may include N−2 delay units. The device also includes a mapper configured to map the outgoing data stream for transmission over a communication channel.

According to another embodiment, the present invention provides a communication device that includes a first convolutional interleaver configured to generate a first interleaved stream based on a first FEC data stream. The device also includes a first Hamming encoder configured to encode the first interleaved stream and generate a first Hamming codeword stream. The device also includes a second convolutional interleaver configured to generate a second interleaved stream based on a second FEC data stream. The device also includes a second Hamming encoder configured to encode the second interleaved stream and generate a second Hamming codeword stream. The device also includes a Hamming codeword interleaver configured to generate an outgoing data stream by interleaving at least the first Hamming codeword stream and the second Hamming codeword stream. The Hamming codeword interleaver may include a first memory configured to interleave the first Hamming codeword stream and the second Hamming codeword stream to generate the outgoing data stream. The first memory may include a memory with N rows and M columns. The Hamming codeword interleaver being configured to write the first hamming codeword stream row-by-row. The outgoing data stream is generated by reading the first memory column-by-column.

According to yet another embodiment, the present invention provides a communication device that includes a communication interface coupled to a communication channel for receiving an incoming data signal. The device also includes a soft sequence detector configured to generate log likelihood ratio (LLR) values associated with the incoming data signal. The device also includes a deinterleaver configured to de-interleave the incoming data signal and distribute the LLR values accordingly for an inner soft forward error correction (SFEC) process to generate a deinterleaved data stream. The device also includes an inner SFEC decoder configured to process the deinterleaved data stream It is to be appreciated that embodiments of the present invention provide many advantages over conventional techniques. Among other things, by interleaving symbols with soft FEC encoding, embodiments of the present invention provide effective error correction, especially in the presence of correlated errors (e.g., ISI and others). In various embodiments, the inner interleaving mechanisms according to the present invention are used synergistically in conjunction with other encoding and interleaving techniques, such as Hamming codeword interleaving, thereby a high level of performance can be achieved.

Embodiments of the present invention can be implemented in conjunction with existing systems and processes. For example, encoding and interleaving mechanisms according to the present invention can be implemented using existing manufacturing equipment and processes. Additionally, inner SFEC and interleaving mechanisms and methods are compatible with existing systems and devices, and thus can be readily adapted for a wide range of applications. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
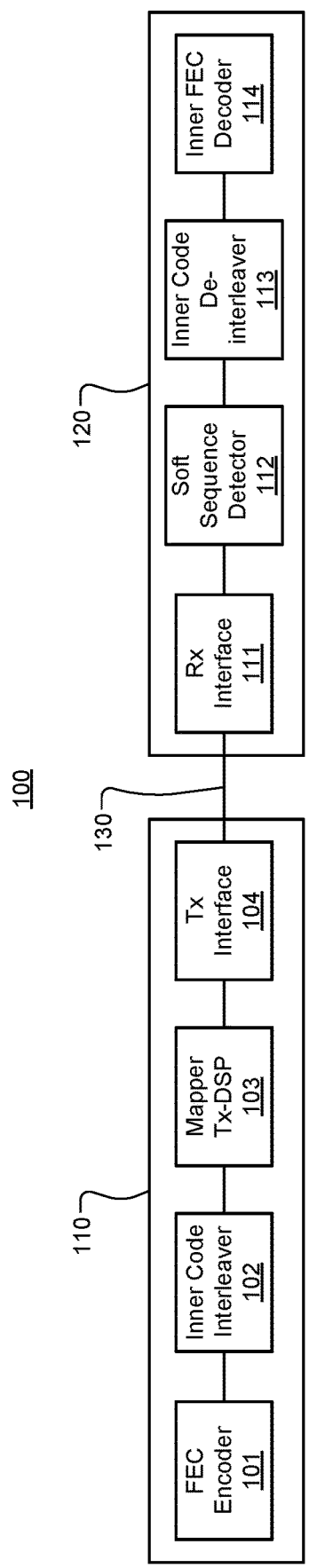
FIG. 1 is a simplified block diagram illustrating a communication system according to embodiments of the present invention.

The present invention is directed to communication systems and methods. According to a specific embodiment, FEC data streams from multiple FEC data lanes are received. First stage interleaving and inner encoding are performed on the FEC data streams to generate inner encoded data streams. A second stage interleaving process is performed to interleave the inner encoded data streams. There are other embodiments as well.

Error correction and encoding mechanisms thereof are an important aspect of data communication. For example, soft forward error correction (SFEC) and interleaving techniques are described in U.S. patent application Ser. No. 16/818,864 and incorporated by reference. Depending on the implementation, SFEC mechanism can be implemented in many ways, such as single-parity-check and Hamming codewords. It is understood that the term "SFEC" refers to the soft-decodable code that is used for encoding.

In communication systems, there are different types of noises. For example, link noises are often removed using equalization techniques. Some noises are related (e.g., error with "memory"), such as intersymbol interference (ISI), and they can be removed using soft sequence detectors. It is to be appreciated that embodiments of the present invention provide interleaving techniques implemented in conjunction with soft sequence detectors.

In a specific embodiment, the present invention provides a system that uses SFEC (or its variants) in combination with a soft sequence detector that equalizes a partial response channel. For example, the soft sequence detector may be a trellis-based processor (e.g., SOVA, BCJR, MAX-LOG-MAP) for pulse-amplitude modulation (PAM) (e.g., PAM4/PAM6/PAM8 on a 1+αD partial response channel). For example, a soft sequence detector in an exemplary receiver generates the reliabilities (e.g., log likelihood ratio, or LLRs) that are the inputs to the SFEC decoder.

It is to be understood that one of the challenges introduced by the sequence detection mechanism is that errors (and corresponding reliabilities) at its output are correlated, which degrades the performance of low-complexity FEC decoders. It is to be appreciated that suitable interleaving mechanisms are used to enable excellent end-to-end performance. More specifically, interleaving mechanisms-over multiple SFEC codewords—are implemented in the transmitters, and de-interleaving mechanisms are implemented in the receivers. It is to be appreciated that interleaving mechanisms according to embodiments of the present invention can—without requiring a complex FEC decoder—decorrelate LLRs, add minimal end-to-end latency, and minimize performance degradation.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

FIG. 1 is a simplified block diagram illustrating a communication system according to embodiments of the present invention. This diagram is merely an example, which should not unduly limit the scope of the claims. One of ordinary skill in the art would recognize many variations, alternatives, and modifications. As an example, communication system 100 includes transmitter 110 and receiver 120, which are connected via communication channel 130. For example, communication channel 130 may be an optical communication link, and PAM communication is used. Depending on the implementation, communication channel 130 may be implemented using a high-speed wired connection or other types of links.

Transmitter 110 includes an FEC encoder 101. For example, the FEC encoder 101 may be implemented with an SFEC encoder (e.g., with soft-decodable code), and the FEC encoder 101 may include block interleaver (illustrated in FIG. 2) or convolutional interleaver (illustrated in FIG. 3) as part of the encoding process. The output of FEC encoder 101 is interleaved at block 102 (e.g., illustrated in FIGS. 4-8). For example, inner codeword interleaver 102 produces an output that consists of time-interleaved inner codewords. A detailed description of the inner codeword interleaving mechanisms is described in further detail below. Block 103 includes a mapper that transforms pairs of consecutive bits to PAM4 symbols (optionally with precoding). In various embodiments, block 103 also includes transmission digital signal processing (TX DSP) that distorts the transmitted PAM4 sequence (i.e., mapper output) to pre-compensate for line impairments. The output of block 103 is processed at transmission interface block 104. For example, block 104 includes various components (e.g., modulator, driver, etc.) for sending data to receiver 120 via communication link 130.

Receiver 120 first processes data received from communication link 130 using receiver (Rx) interface block 111. For example, block 111 includes various components such as termination circuit, equalizer, and variable gain amplifier (VGA) that perform initial processes. In various embodiments, block 111 performs timing recovery, and it may include equalization and impairment mitigation. For example, block 111 induces a partial response channel at the soft sequence detector input. The soft sequence detector 112 is configured to generate LLRs for each received unit interval (UI). Block 113 includes a deinterleaver that reorders the LLRs output by the soft sequence detector. For example, the soft inner FEC decoder assumes that LLRs are independent identically distributed at its input. Block 114 includes an inner FEC decoder. For example, parameters of the inner codeword deinterleaver at block 113 depend on the choice of inner SFEC in block 114.

Figure 2:
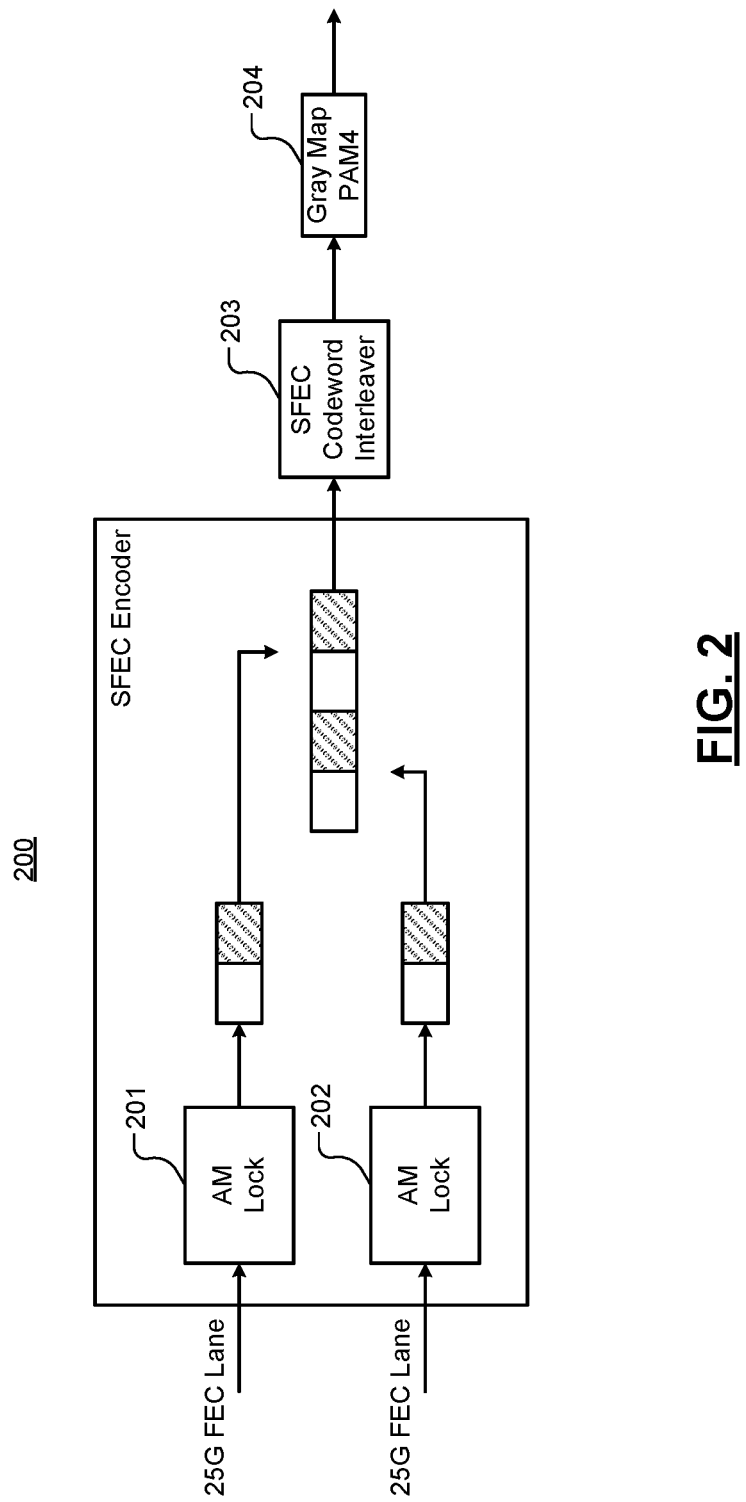
FIG. 2 is a simplified block diagram illustrating a two-lane transmitter according to embodiments of the present invention.

FIG. 2 is a simplified block diagram illustrating a two-lane transmitter according to embodiments of the present invention. This diagram is merely an example, which should not unduly limit the scope of the claims. One of ordinary skill in the art would recognize many variations, alternatives, and modifications. Transmitter 200, as shown, includes two 25G FEC lanes with their respective data streams. The first FEC lane is coupled to AM lock block 201; the second FEC lane is coupled to AM block 202. For example, AM lock blocks 201 and 202 are configured to align incoming data stream, and their output data blocks (e.g., even and odd blocks) are encoded by an SFEC encoder and form a single data stream that goes to block 203. In various embodiments, SFEC is configured as one encoder per physical lane; the encoding process appends one PAM4 parity symbol to every 20 UI payload. For example, each SFEC codeword corresponds to 21 PAM4 UI. Block 203 comprises an SFEC codeword interleaver as shown. For example, a single codeword interleaver at block 203 is configured to interleave the combined data stream. In various implementations where multiple sequence detectors are present in the receiver, a transmitter includes multiple codeword interleavers, each being configured for each physical data lane in the transmitter.

Figure 3:
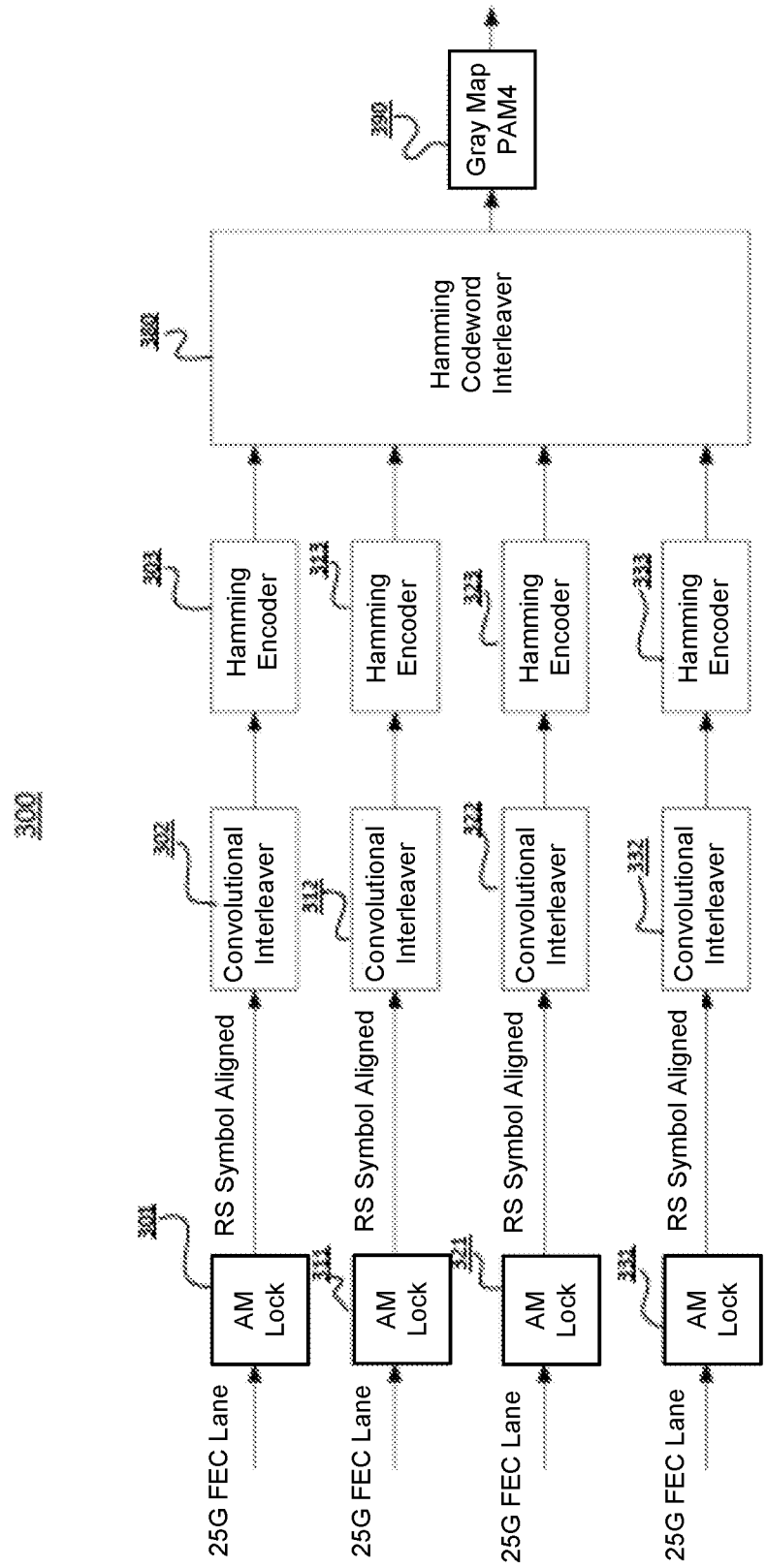
FIG. 3 is a simplified diagram illustrating a four-lane transmitter according to embodiments of the present invention.

FIG. 3 is a simplified diagram illustrating a four-lane transmitter according to embodiments of the present invention. This diagram is merely an example, which should not unduly limit the scope of the claims. One of ordinary skill in the art would recognize many variations, alternatives, and modifications. Transmitter 300 includes four 25G FEC lanes (e.g., configured as physical lanes), each having its own convolutional interleaver and Hamming encoder. For example, Hamming encoding is applied per FEC Lane; block 380 combines the Hamming-encoded outputs of multiple FEC lanes to form a physical lane (e.g., four for 100G physical lane, or two for 50G physical lane). In a specific embodiment, each Hamming codeword consists of 128 bits (i.e., 64 UI of PAM4). The data of these four 25G FEC lanes are interleaved by Hamming codeword interleaver 380 as shown. The output of block 380 is processed by Gray mapper at block 390 to prepare data for PAM4 communication.

Figure 4A:
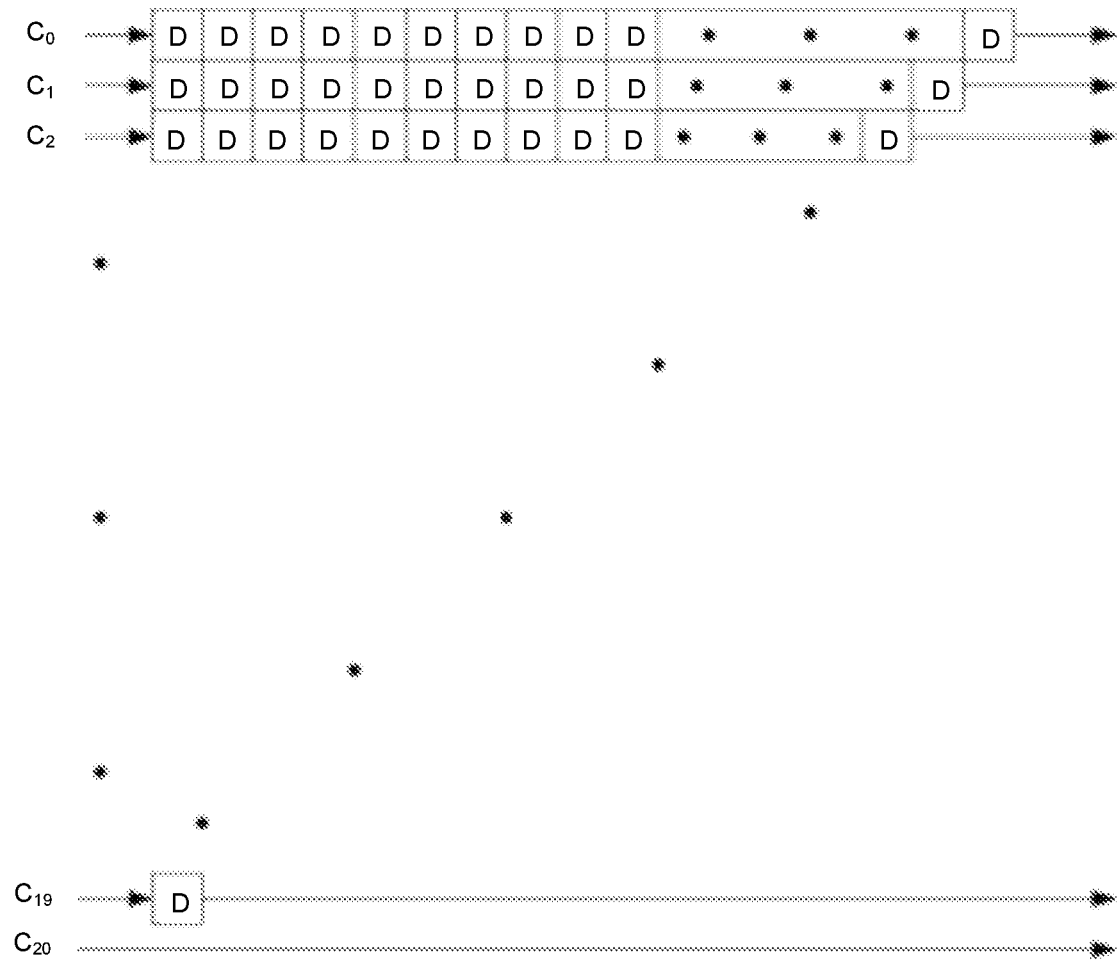
FIG. 4A-4C are simplified diagrams illustrating interleaving techniques according to embodiments of the present invention.
Figure 4B:
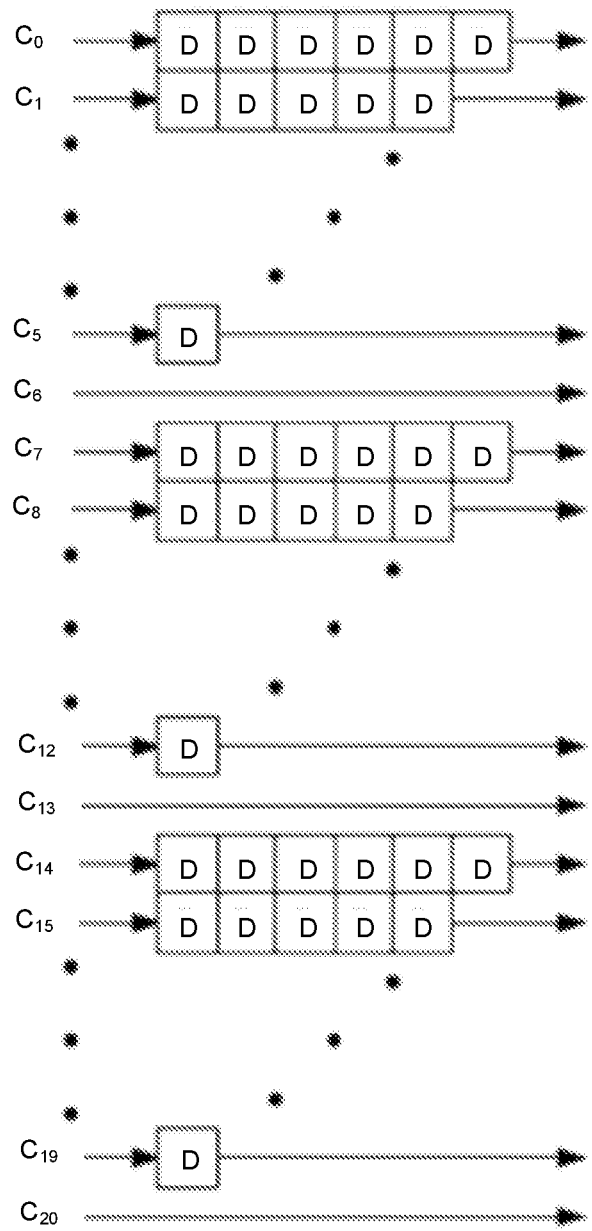
Figure 4C:
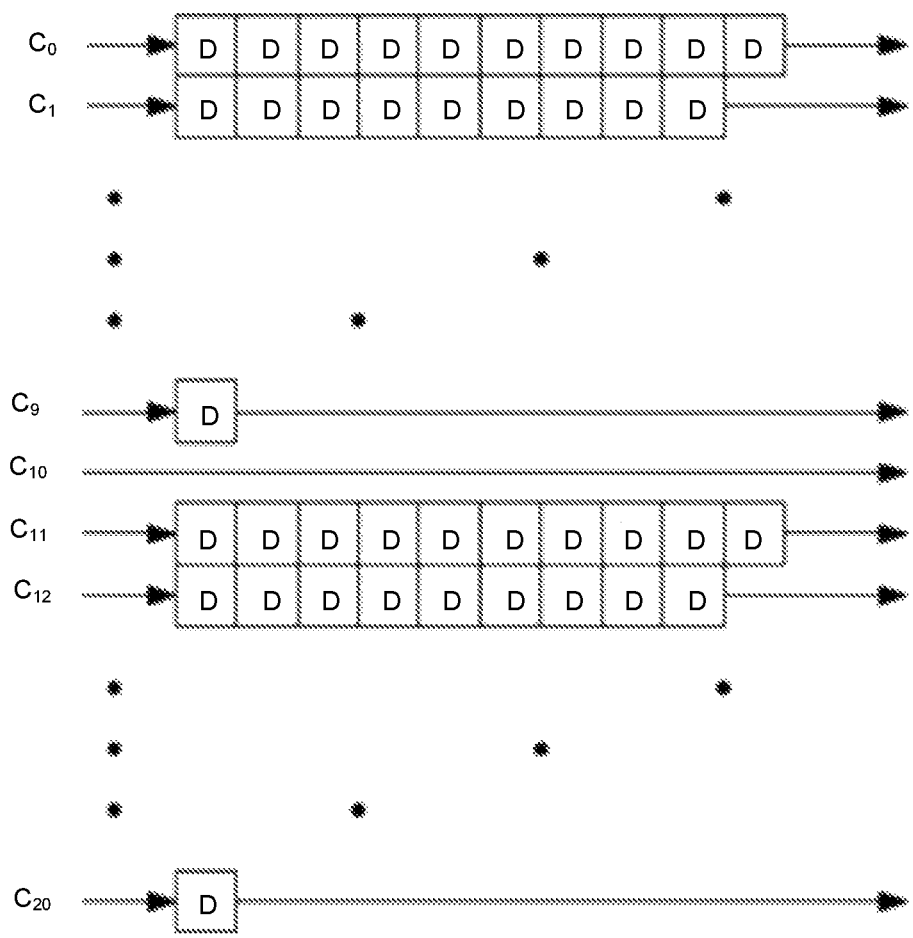

FIGS. 4A-4C are simplified diagrams illustrating interleaving techniques according to embodiments of the present invention. These diagrams merely provide an example, which should not unduly limit the scope of the claims. One of ordinary skill in the art would recognize many variations, alternatives, and modifications. For example, the interleaving techniques illustrated in FIGS. 4A-4C illustrate convolutional interleaving of codewords.

As FIG. 4A illustrates, an SFEC encoded data stream is interleaved 21-ways using a convolutional interleaver. For example, each codeword includes a number of PAM symbols (e.g., 2-bit data for PAM4 implementation). More specifically, 21 UI codewords (denoted by $c_0, c_1, \ldots, c_{20}$) are written into 21 delay lines (i.e., each "D" in FIG. 4A denotes a delay unit). Simultaneously, 21 UIs are read out from the 21 delay lines to be transmitted over a communication channel. For example, line $c_0$ includes 20 delay units, line $c_1$ includes 19 delay units, and $c_{20}$ includes no delay units, and the output of the interleaving mechanism is generated accordingly. The maximum delay among all delay lines defines the depth of the codeword interleaver. The interleaving mechanism in FIG. 4A comprises 21 delay lines, and has a depth of 21. It is to be understood that latency, area, and power consumption of the interleaver increases linearly with the interleaving depth. At the same time, the resilience to correlated errors also increases with the interleaving depth.

FIG. 4B illustrates an interleaving mechanism-specifically configured for inner error correction characterized by a depth of seven. It is to be noted that there are still 21 lines denoted by $c_0$ to $c_{20}$, but they are grouped. For example, lines $c_0$ to $c_6$ are in the first group with a depth of seven, lines $c_7$ to $c_{13}$ are in the second group of seven, and lines $c_{14}$ to $c_{20}$ are in the third group. FIG. 4C illustrates an interleaving mechanism—specifically configured for inner error correction—characterized by a depth of ten, where lines $c_0$ to $c_{20}$ are grouped.

Figure 5:
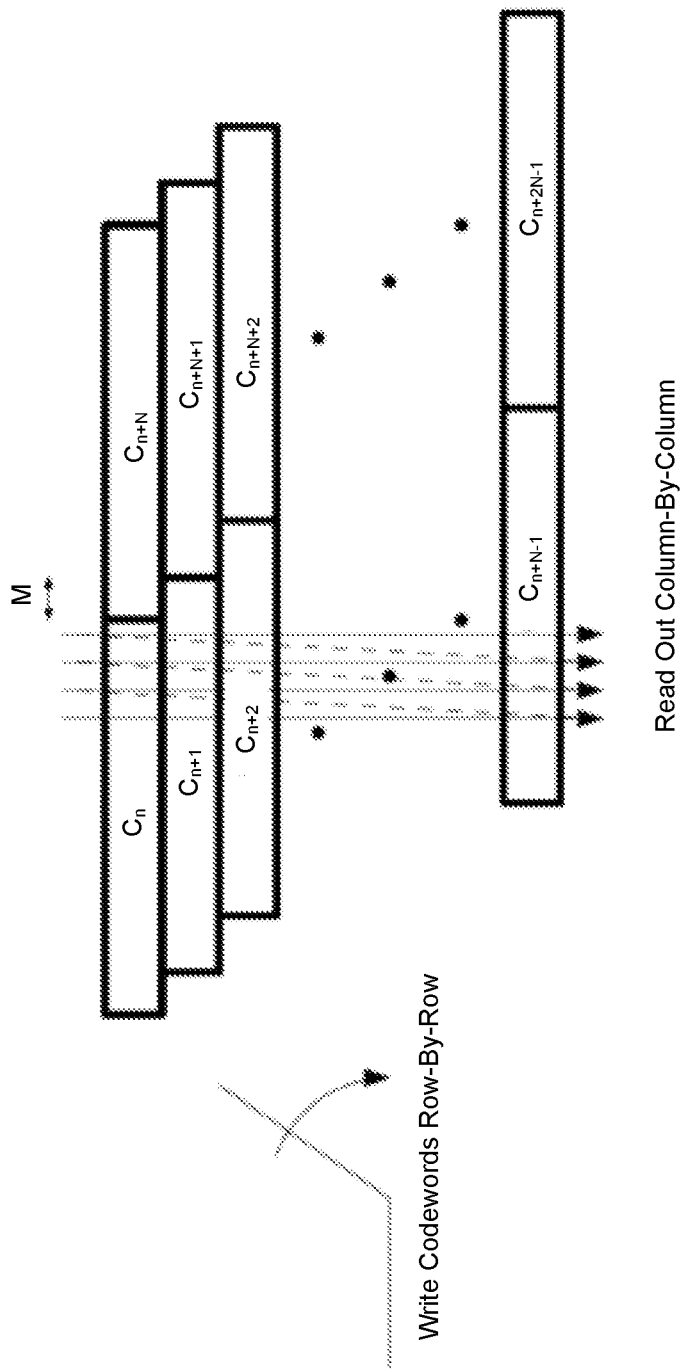
FIG. 5 is a simplified block diagram illustrating a column-based interleaving mechanism according to embodiments of the present invention.

FIG. 5 is a simplified block diagram illustrating a column-based interleaving mechanism according to embodiments of the present invention. This diagram is merely an example, which should not unduly limit the scope of the claims. One of ordinary skill in the art would recognize many variations, alternatives, and modifications. As an example, 203 in FIG. 2 can be implemented using the column-based mechanism illustrated in FIG. 5. As shown in FIG. 5, there are N rows of data, interleaving is performed by writing codeword data row by row, and reading data column by column at predetermined interleaved locations (e.g., $C_n$ to $C_{n+N-1}$ correspond to interleaving locations corresponding to the N rows of data). As an example, the interleaving mechanism illustrated in FIG. 5 can be implemented using various types of memories and registers. In various embodiments, SFEC codewords (indexed according to their orders of generation) are written to rows of a two-dimensional memory: N is the depth of the interleaver (in units of SFEC codewords), and M is the shift (e.g., in units of PAM4 UI) between codeword boundaries in consecutive rows of the interleaver structure. For example, for each column, read out 2 bits (i.e., 1 PAM4 UI) per SFEC codeword intersected by the column. For M=0, the interleaver is reduced to a standard block interleaver. In various embodiments, M is selected to minimize the end-to-end latency such that $M \cdot N \cong 21$, where 21 is the SFEC codeword length in UI. It is to be appreciated that an advantage of setting $M \cdot N \cong 21$ is that the codewords "arrive" at the receiver at a regular rate, which can simplify hardware implementation. In comparison, when M=0, all N codewords will arrive at essentially the same time, and thus will need to be decoded simultaneously to minimize end-to-end latency, which requires additional hardware. Depending on the implementation, the interleaving mechanism illustrated in FIGS. 4A-C (e.g., convolutional interleaving) provides certain advantages over the interleaving mechanisms illustrated in FIG. 6. Among other features, a convolutional interleaver can be configured within a smaller area for a fixed interleaving depth, which also minimizes power consumption. Typically, a deinterleaver consumes more power than an interleaver, since it processes multi-bit resolution LLRs. Additionally, SFEC codewords arrival times are smoothed out. At the same time, synchronization of the convolutional deinterleaver switches requires knowledge of the codeword boundaries, which increases the complexity of initially locking to the codeword boundaries in the receiver, but does not have much—if any—impact on the power, performance, or end-to-end latency.

Figure 6:
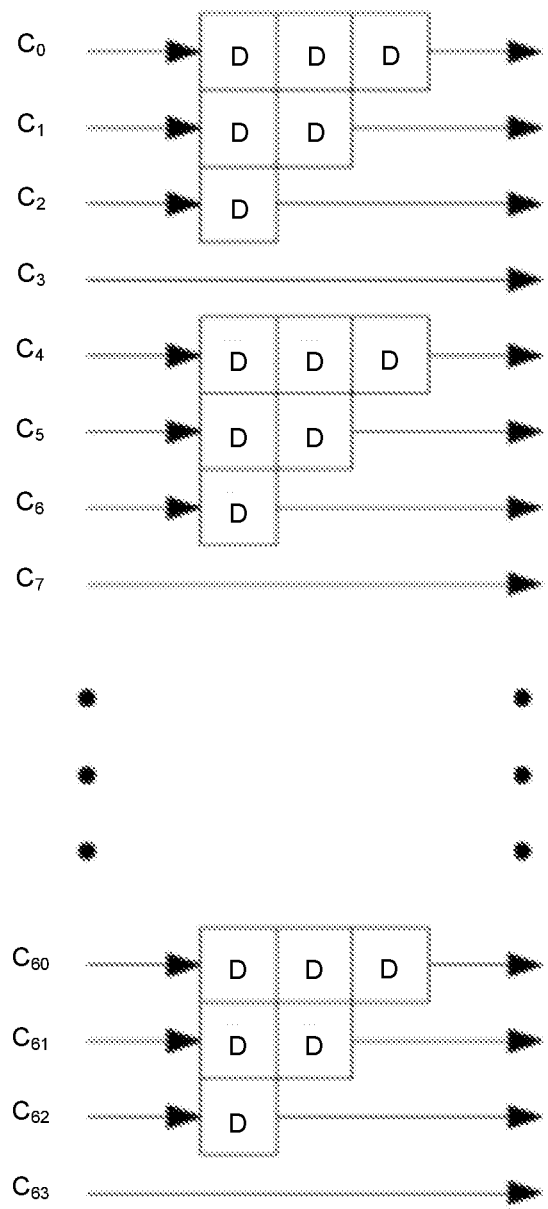
FIG. 6 is a simplified diagram illustrating a Hamming codeword interleaving process according to embodiments of the present invention.

FIG. 6 is a simplified diagram illustrating a Hamming codeword interleaving process according to embodiments of the present invention. This diagram is merely an example, which should not unduly limit the scope of the claims. One of ordinary skill in the art would recognize many variations, alternatives, and modifications. As an example, the interleaving mechanism illustrated in FIG. 6 includes 64 lines (i.e., $c_0$ through $c_{63}$) that are configured into depth-4 groups, and convolutional interleaving is performed. In a specific embodiment, FEC lanes 0/1/2/3 provide the Hamming codeword input to a convolutional interleaver in a round-robin ordering, wherein lines $c_0$ thru $c_{63}$ correspond to the 64 UI from a single Hamming codeword. The use of convolutional interleaver proposal can minimize the amount of storage required for the receiver de-interleaver. Also, a convolutional interleaver can smooth out codeword arrival times.

Figure 7:
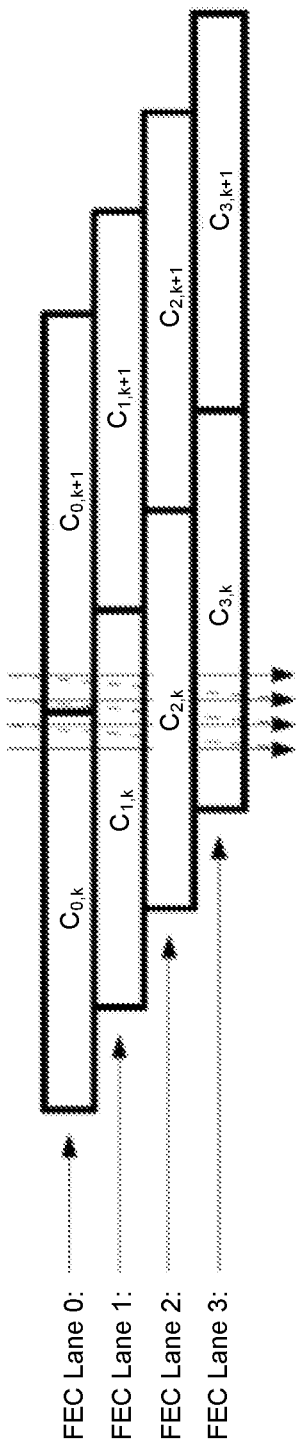
FIG. 7 is a simplified diagram illustrating a four-lane Hamming codeword interleaving mechanism according to embodiments of the present invention.

FIG. 7 is a simplified diagram illustrating a four-lane Hamming codeword interleaving mechanism according to embodiments of the present invention. This diagram is merely an example, which should not unduly limit the scope of the claims. One of ordinary skill in the art would recognize many variations, alternatives, and modifications. As an example, a Hamming codeword interleaver is implemented similar to the SFEC interleaver described above, with certain distinctions. For example, the interleaving depth N is an integer multiple of the number of FEC lanes combined to form a physical lane. Performance and latency scale with N. Indexing the FEC lanes that form a physical lane by i, $i \in \{0, 1, \ldots, p-1\}$, codewords from FEC lane i gets written to interleaver rows with row index i (modulo p). In FIG. 7, a 100G physical lane is mapped from four 25G FEC lanes, where N=4, M=16 (Note: $N \cdot M=64$, the number of UI in a Hamming codeword).

Figure 8:
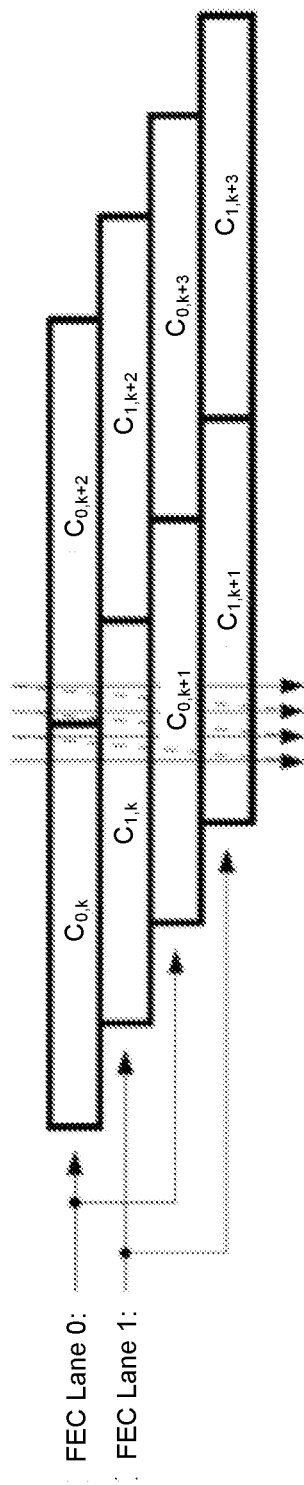
FIG. 8 is a simplified diagram illustrating a two-lane Hamming codeword interleaving mechanism according to embodiments of the present invention.

FIG. 8 is a simplified diagram illustrating a two-lane Hamming codeword interleaving mechanism according to embodiments of the present invention. This diagram is merely an example, which should not unduly limit the scope of the claims. One of ordinary skill in the art would recognize many variations, alternatives, and modifications. As an example, a 50G physical lane is mapped from two 25G FEC lanes, where N=4, M=16 (Note: $N \cdot M=64$, the number of UI in a Hamming codeword). It is to be appreciated that, depending on the implementation, Hamming codewords can be interleaved in many ways, which are described in U.S. patent application Ser. No. 16/818,864.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A communication device for transmitting data over an optical communication link in a communication system, the communication device comprising:
   a plurality of first interleavers, each first interleaver configured to (i) receive a forward error correction (FEC) data stream from a respective FEC data lane, and (ii) interleave the FEC data stream to generate an interleaved stream;
   a plurality of encoders configured to receive the interleaved streams from respective ones of the plurality of first interleavers and encode the interleaved streams to generate encoded interleaved streams containing soft-decodable code corresponding to the interleaved streams;
   a second interleaver configured to interleave the encoded interleaved streams previously encoded by the plurality of encoders to generate an outgoing data stream comprising time-interleaved inner codewords of the encoded interleaved streams, the second interleaver being further configured to apply different delays to the encoded interleaved streams received by the second interleaver by applying a delay to respective ones of the encoded interleaved streams in a group of the encoded interleaved streams, wherein a respective delay being applied to a respective stream is different than delays applied to each other encoded interleaved stream in the group of the encoded interleaved streams, to reduce latency associated with the second interleaver receiving the encoded interleaved streams at a same time; and
   a mapper configured to map the outgoing data stream into symbols for transmission over the optic communication link.

2. The communication device of claim 1 wherein the encoders comprise Hamming encoders.

3. The communication device of claim 1 wherein the encoders comprise parity-check encoders configured to add parity symbols to the interleaved streams.

4. The communication device of claim 1 wherein the mapper comprises a Gray mapper configured to prepare data for PAM4 communication.

5. The communication device of claim 1, the second interleaver comprising M lines corresponding to an interleaving depth of N, the M lines comprising a first delay line and a second delay line, the first delay line comprising N−1 delay units, and the second delay line comprising N−2 delay units, wherein N is 21.

6. The communication device of claim 1, the second interleaver comprising M lines corresponding to an interleaving depth of N, the M lines comprising a first delay line and a second delay line, the first delay line comprising N−1 delay units, and the second delay line comprising N−2 delay units, wherein N is 4.

7. The communication device of claim 1, the second interleaver comprising M lines corresponding to an interleaving depth of N, the M lines comprising a first delay line and a second delay line, the first delay line comprising N−1 delay units, and the second delay line comprising N−2 delay units, wherein N is 7.

8. The communication device of claim 1, the second interleaver comprising M lines corresponding to an interleaving depth of N, the M lines comprising a first delay line and a second delay line, the first delay line comprising N−1 delay units, and the second delay line comprising N−2 delay units, wherein N is 10.

9. A method of operating a communication device for transmitting data over an optical communication link in a communication system, the method comprising:
   using each first interleaver of a plurality of first interleavers, (i) receiving a forward error correction (FEC) data stream from a respective FEC data lane, and (ii) interleaving the FEC data stream to generate an interleaved stream;
   using a plurality of encoders, receiving the interleaved streams from respective ones of the plurality of first interleavers and encoding the interleaved streams to generate encoded interleaved streams containing soft-decodable code corresponding to the interleaved streams;
   using a second interleaver, interleaving the encoded interleaved streams previously encoded by the plurality of encoders to generate an outgoing data stream comprising time-interleaved inner codewords of the encoded interleaved streams, interleaving the encoded interleaved streams including applying different delays to the encoded interleaved streams received by the second interleaver by applying a delay to respective ones of the encoded interleaved streams in a group of the encoded interleaved streams, wherein a respective delay being applied to a respective stream is different than delays applied to each other encoded interleaved stream in the group of the encoded interleaved streams, to reduce latency associated with the second interleaver receiving the encoded interleaved streams at a same time; and
   mapping the outgoing data stream into symbols for transmission over the optic communication.

10. The method of claim 9 wherein encoding the interleaved streams comprises encoding the interleaved streams using Hamming encoders.

11. The method of claim 9 wherein encoding the interleaved streams comprises using parity-check encoders configured to add parity symbols to the interleaved streams.

12. The method of claim 9 wherein mapping the outgoing data stream comprises a using a Gray mapper configured to prepare data for PAM4 communication.

13. The method of claim 9, wherein using the second interleaver comprises using M lines corresponding to an interleaving depth of N, the M lines comprising a first delay line and a second delay line, the first delay line comprising N−1 delay units, and the second delay line comprising N−2 delay units, wherein N is 21.

14. The method of claim 9, wherein using the second interleaver comprises using M lines corresponding to an interleaving depth of N, the M lines comprising a first delay line and a second delay line, the first delay line comprising N−1 delay units, and the second delay line comprising N−2 delay units wherein N is 4.

15. The method of claim 9, wherein using the second interleaver comprises using M lines corresponding to an interleaving depth of N, the M lines comprising a first delay line and a second delay line, the first delay line comprising N−1 delay units, and the second delay line comprising N−2 delay units, wherein N is 7.

16. The method of claim 9, wherein using the second interleaver comprises using M lines corresponding to an interleaving depth of N, the M lines comprising a first delay and a second delay line, the first delay line comprising N−1 delay units, and the second delay line comprising N−2 delay units, wherein N is 10.

\* \* \* \* \*